(12) United States Patent
Hoffman et al.

(10) Patent No.: US 6,765,796 B2
(45) Date of Patent: Jul. 20, 2004

(54) CIRCUIT BOARD COVER WITH EXHAUST APERTURES FOR COOLING ELECTRONIC COMPONENTS

(75) Inventors: Mark S. Hoffman, Burlington, MA (US); David C. Drahms, Cambridge, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/301,774

(22) Filed: Nov. 21, 2002

(65) Prior Publication Data

US 2004/0100773 A1 May 27, 2004

(51) Int. Cl.[7] .................................................. H05K 7/20
(52) U.S. Cl. ...................... 361/695; 361/689; 361/687; 174/35 R; 165/121
(58) Field of Search ........................ 454/184; 312/2.36; 174/16.1, 16.3, 35 R; 165/80.3, 185, 121–126, 908; 257/706, 712, 713, 721, 722; 361/690, 692, 694–697, 703, 704, 717–719, 720, 796, 800

(56) References Cited

U.S. PATENT DOCUMENTS

| | | | |
|---|---|---|---|
| 4,233,644 A | 11/1980 | Hwang et al. ............... 361/384 |
| 4,277,816 A | 7/1981 | Dunn et al. .................. 361/384 |
| 4,296,455 A | * 10/1981 | Leaycraft et al. ........... 361/691 |
| 4,498,118 A | 2/1985 | Bell ............................ 361/384 |
| 4,851,965 A | 7/1989 | Gabuzda et al. ............. 361/383 |
| 5,021,924 A | 6/1991 | Kieda et al. ................. 361/385 |
| 5,063,476 A | 11/1991 | Hamadah et al. ............ 361/384 |
| 5,067,047 A | 11/1991 | Azar ........................... 361/384 |
| 5,196,989 A | 3/1993 | Zsolnay ....................... 361/383 |
| 5,218,513 A | 6/1993 | Brown ......................... 361/384 |
| 5,285,347 A | 2/1994 | Fox et al. .................... 361/385 |
| 5,285,350 A | 2/1994 | Villaume ..................... 361/690 |
| 5,304,845 A | 4/1994 | Lindquist et al. ........... 257/722 |
| 5,361,188 A | 11/1994 | Kondou et al. ............. 361/695 |
| 5,424,914 A | 6/1995 | Smith et al. ................. 361/694 |
| 5,446,619 A | 8/1995 | Madsen et al. .............. 361/695 |
| 5,467,815 A | 11/1995 | Haumann et al. ......... 165/109.1 |
| 5,576,932 A | 11/1996 | Bishop et al. ............... 361/697 |
| 5,592,363 A | 1/1997 | Atarashi et al. ............. 361/689 |
| 5,604,665 A | 2/1997 | Chrysler et al. ............. 361/703 |
| 5,640,046 A | 6/1997 | Suzuki et al. ................ 257/714 |
| 5,894,407 A | 4/1999 | Aakalu et al. ............... 361/695 |
| 5,912,800 A | 6/1999 | Sammakia et al. ......... 361/690 |
| 5,912,802 A | 6/1999 | Nelson ......................... 361/695 |
| 5,940,266 A | 8/1999 | Hamilton et al. ........... 361/695 |
| 6,226,182 B1 | * 5/2001 | Maehara ...................... 361/695 |
| 6,348,748 B1 | 2/2002 | Yamamoto .................... 310/62 |
| 6,366,462 B1 | 4/2002 | Chu et al. .................... 361/699 |
| 6,442,024 B1 | 8/2002 | Shih ............................ 361/695 |
| 6,449,150 B1 | * 9/2002 | Boone ......................... 361/694 |
| 6,452,797 B1 | 9/2002 | Konstad ...................... 361/695 |
| 6,462,948 B1 | 10/2002 | Leija et al. .................. 361/697 |

OTHER PUBLICATIONS

"Burn–in Fixture for Modules", R. Brzyski et al., IBM Technical Disclosure Bulletin, vol. 27, No. 7B, Dec. 1984.
Richard Nelson, Thomas Dolbear, Kim Chen and Clinton Chao, "Application of Air Cooled Microchannel Heat Exchanges to Card Cage Systems", 1993, pp. 50–62.

\* cited by examiner

*Primary Examiner*—Michael Datskovsky
(74) *Attorney, Agent, or Firm*—Bruce D. Rubenstein; Teradyne Legal Dept.

(57) ABSTRACT

A cover attaches to a circuit board and has an inlet at one side for receiving forced air and plurality of openings on its top surface through which heat sinks mounted on the circuit board partially extend. Air is made to flow into the inlet and out the exhaust openings, thereby concentrating airflow in the vicinity of the circuit board's heat dissipative components.

18 Claims, 3 Drawing Sheets

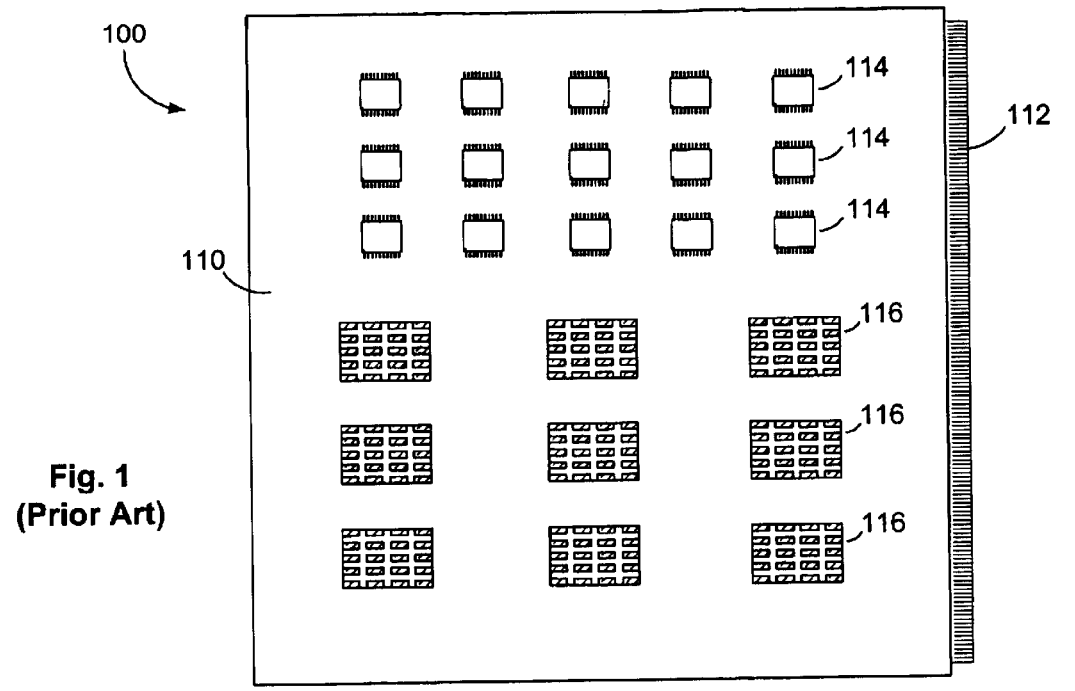
Fig. 1
(Prior Art)
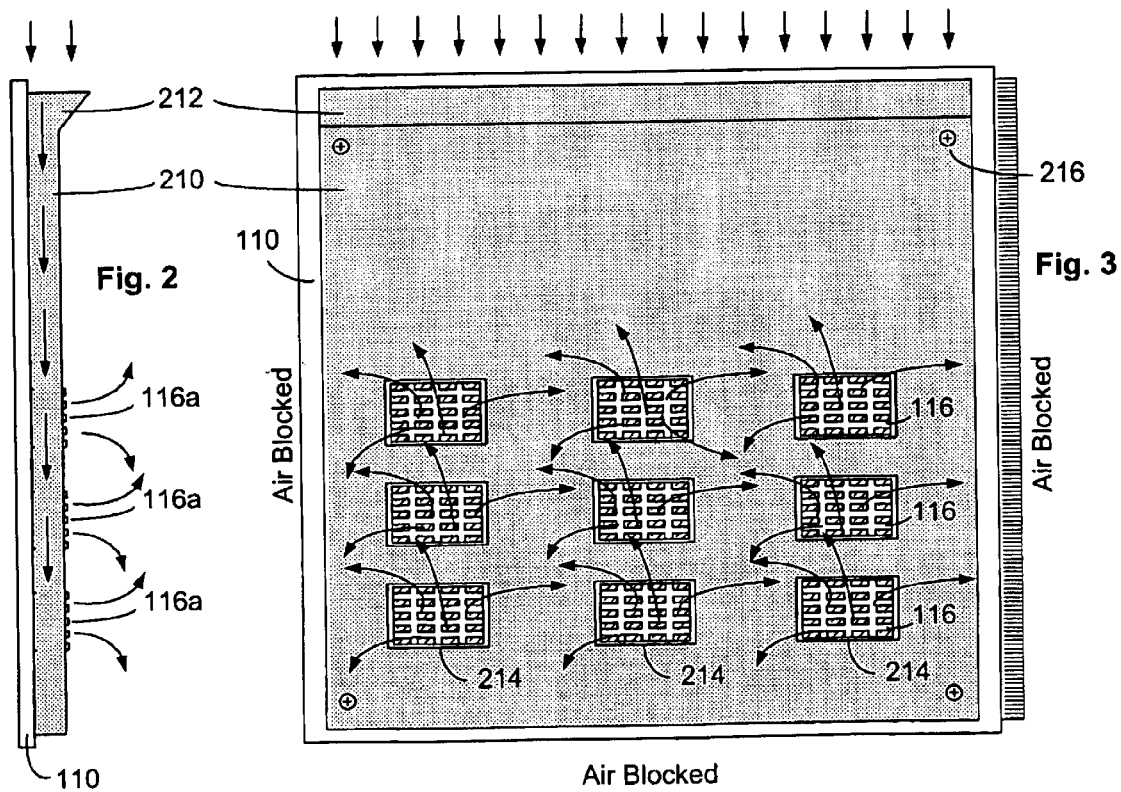
Fig. 2
Fig. 3

Inlet Side

Outlet Side

CIRCUIT BOARD COVER WITH EXHAUST APERTURES FOR COOLING ELECTRONIC COMPONENTS

CROSS-REFERENCES TO RELATED APPLICATIONS

Not Applicable.

STATEMENT REGARDING FEDERALLY SPONSORED RESEARCH OR DEVELOPMENT

Not Applicable.

Reference to Microfiche Appendix

Not Applicable.

BACKGROUND OF THE INVENTION

1. Field of the Invention

This invention relates generally to techniques for cooling dissipative electrical and electronic components, and, more particularly, to a technique for cooling such components on circuit boards through the direction of exhaust air.

2. Description of Related Art

Electrical and electronic devices commonly require either convection or forced-air cooling to maintain safe and reliable operating temperatures. To cool these devices, a heat sink is generally attached to a device package to promote an efficient flow of heat from the device to the heat sink, and from the heat sink to the surrounding environment. As is known, forcing air through or across a heat sink greatly improves its cooling efficiency. To this end, various techniques have been devised for directing air at heat sinks for cooling heat sinked components.

According to one such technique, forced air is directed across an entire circuit board having one or more heat sinked components. Air is made to flow across all components of the circuit board, including both the heat sinked and non-heat sinked components, to provide cooling generally to the entire board. Although this approach is simple and straightforward, it tends to also be inefficient. Particularly when cards are installed in slots of a card cage, heat sinked components tend to block more air than components without heat sinks. This blockage tends to encourage air flow through paths of lesser resistance, around the heat sinks, rather than across or though the heat sinks. Consequently, the components needing the greatest airflow tend to receive the least.

A significant improvement over this approach is to specifically direct airflow to the components that require it most. Air direction can be achieved through air conduits or baffles, which apply intake air directly onto the heat sinks of the most dissipative components. An example of this approach is disclosed in U.S. Pat. No. 5,063,476 to Hamadah et al. There, intake air is directed from an inlet plenum though a series of nozzles and directly onto the heat sinks of components to be cooled. Air flows though and across the heat sinks and exhausts via an exhaust plenum.

Hamadah's arrangement is particularly efficient; however, it requires significant vertical space above the heat sinks for the inlet plenum, outlet plenum, and nozzles. Vertical space above circuit boards is often in short supply. Circuit boards are commonly installed in card cages that provide slot-to-slot spacing as small as 1 cm. Hamadah's approach may thus cause circuit boards to require greater distance between slots than they would otherwise require. This means that fewer cards and therefore less functionality can be provided within a card cage.

It would therefore be desirable for a cooling approach to be efficient yet applicable in situations where there is little vertical space above a circuit board.

SUMMARY OF THE INVENTION

With the foregoing background in mind, it is an object of the invention to enhance the cooling of heat dissipative electronic components.

To achieve the foregoing object, as well as other objectives and advantages, an electronic assembly includes a substrate, such as a circuit board, and a cover that fits over at least one heat dissapative component mounted on the substrate. The cover is substantially closed against the substrate on all sides except one, where an opening is formed for an air inlet. At least one exhaust opening is formed in the cover above the at least one heat dissapative component. Air flows into the inlet, into the space between the substrate and the cover, and of out the at least one exhaust opening, thus concentrating airflow in the vicinity of the at least one heat dissipative component.

BRIEF DESCRIPTION OF THE DRAWINGS

Additional objects, advantages, and novel features of the invention will become apparent from a consideration of the ensuing description and drawings, in which FIG. 1 is a top view of a circuit board having a variety of components, some of which being highly heat dissipative components that require heat sinking;

FIG. 2 is a side view of the circuit board of FIG. 1, which has been fitted with a cover having apertures in the vicinity of the heat sinked components, according to the invention;

FIG. 3 is a top view of the circuit board of FIG. 1 provided with the apertured cover shown in FIG. 2;

DETAILED DESCRIPTION OF THE PREFERRED EMBODIMENT

Figure 4:
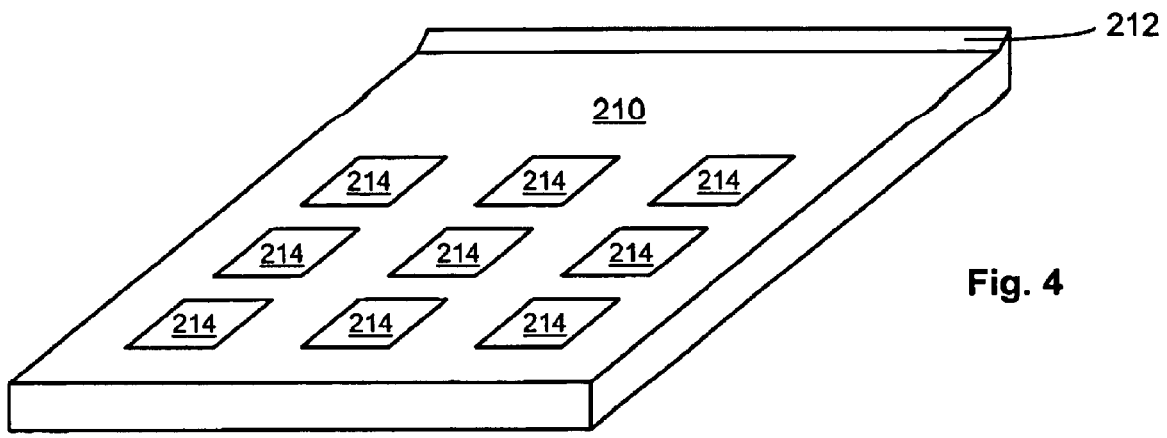
FIG. 4 is an elevated, isometric view of the apertured cover of FIGS. 2 and 3.

FIG. 1 shows a conventional circuit board assembly 100 of the type that is commonly found in electronic systems, such as automatic test systems. The circuit board assembly 100 includes a substrate 110 (e.g., a circuit board), a number of relatively low power electronic components 114, and a number of relatively high power, or heat dissipative, components 116, mounted to the circuit board. Heat sinks are used to facilitate heat transfer between the heat dissipative components 116 and the ambient environment. The circuit board assembly 100 generally plugs into the backplane or other connector of a housing, such as a card cage, via a board,connector 112.

To cool the heat dissipative components 116, air is customarily blown across the surface of the circuit board assembly 100. But because the heat sinks tend to block the flow of air, the velocity of air is greater in the areas between the heat sinks than across or through the heat sinks. Consequently, the heat dissipative components 116 are inefficiently cooled.

FIGS. 2 and 3 show the circuit board assembly 100 of FIG. 1 with an apertured cover 210 in accordance with the invention. FIG. 4 shows a perspective view of this cover. The cover 210 is substantially closed against the circuit board 110 on all sides except one, where the cover is left open to provide an air inlet 212 for receiving pressurized air, such as forced air provided by one or more fans. The circuit board 100 and the cover 210 can thus be regarded as forming a plenum for receiving forced air. The cover includes a plurality of exhaust openings 214 positioned in the vicinity of the heat dissipative components. Preferably, one opening is provided above each of the heat sinks. Air flows into the inlet 212 and over the circuit board 110, but can primarily escape only via the exhaust openings 214. Airflow is thus concentrated in the vicinity of the heat sinks, where the greatest cooling is required.

Preferably, the heat sinks have cooling fins that extend upwardly and partially through the exhaust openings 21 in the cover 210. The openings 21 are preferably sized and shaped to narrowly circumscribe the heat sinks, i.e., to closely conform to the perimeter of the heat sinks, thus causing exhaust air to be directed through the fins of the heat sinks to accomplish more efficient cooling.

It is preferable for the sides of the cover to form an air-tight or nearly air-tight, seal with the circuit board 110; however, this is not required. We have recognized that some leakage may occur between the cover 210 and the circuit board 110, while still preserving the benefits of this design. Thus, while sealing materials, such as gaskets, may be provided, they are not required.

The cover 210 is preferably made of anodized Aluminum. Adequate clearance should preferably be maintained between the cover and electrical components of the circuit board assembly to prevent short circuits in the event that the anodized coating becomes scratched. If tolerances cannot be safely maintained, the cover may be covered with an insulator, such as Mylar® sheet (manufactured by E. I. du Pont de Nemours and Company). Aluminum is a particularly suitable material, as it allows the cover 210 to also be used as an electrostatic shield. The cover 210 is preferably attached to the circuit board via screws 216, although other types of fasteners can be used.

The cover may be made of other metals or materials. One particularly suitable material is LEXAN® sheet, manufactured by the General Electric Company. LEXAN can be drilled, cut, punched, and bent to form the cover 210 from a single sheet.

As best seen in FIG. 2, the inlet 212 of the cover 210 is preferably flanged outwardly, i.e., it opens toward the inlet to capture a greater volume of incoming air. This feature becomes particularly significant in the arrangement of FIG. 5.

Figure 5:
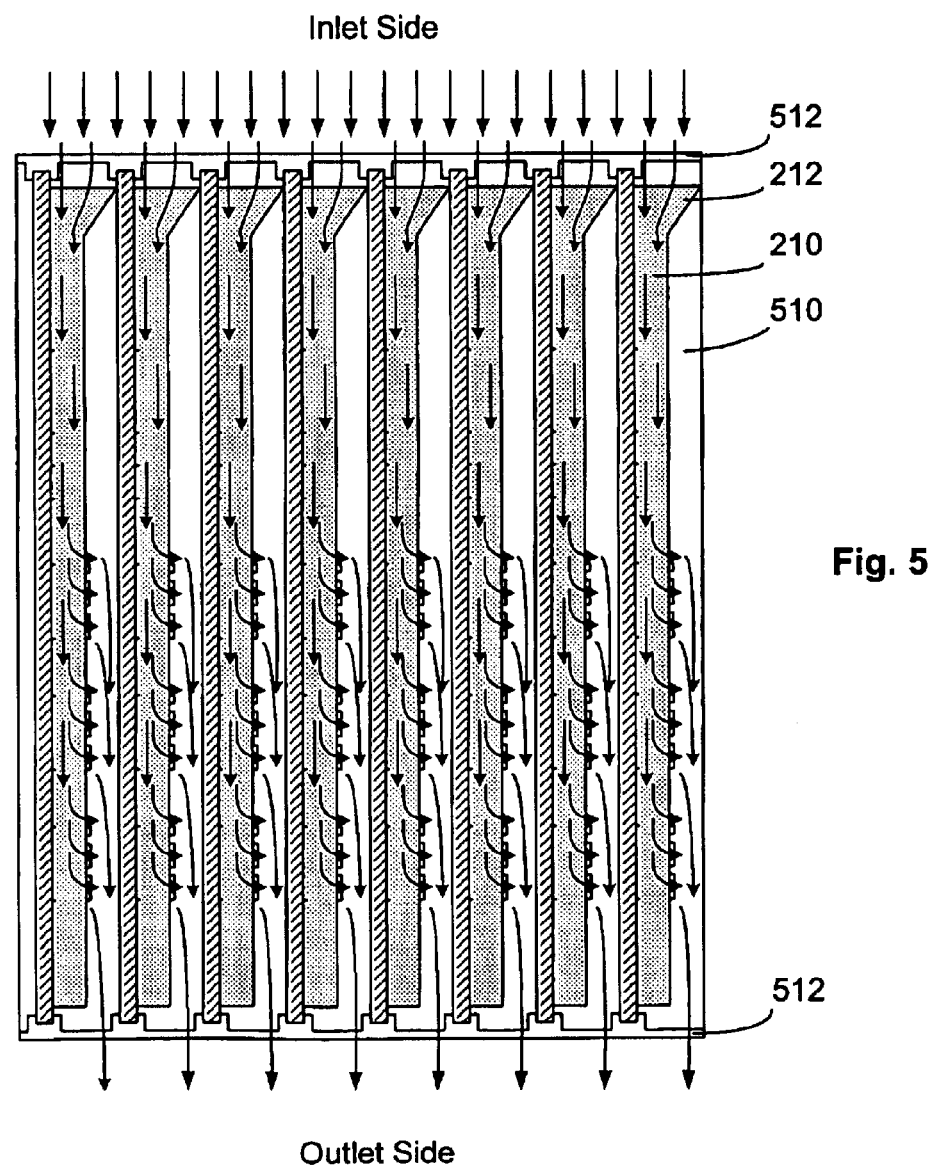
FIG. 5 is a side view of a plurality of circuit boards fitted with apertured covers as shown in FIGS. 2–4, wherein the circuit boards are installed adjacent to each other in a card cage having an inlet side and an exhaust side.

FIG. 5 shows a number of covered circuit board assemblies installed into a housing 510, for example, a card cage. Circuit board assemblies preferably slide into the housing in parallel via card guides 512 and engage a backplane (hot shown) via a respective board connector 112. The housing preferably includes one of more fans or another source of pressurized air for applying cooling air at an inlet side of the housing 510. Air flows from the inlet side, across the circuit board assemblies 100 in the housing, and to an outlet side, shown at the bottom of FIG. 5.

With circuit board assemblies placed adjacent to each other in the card cage, the inlets 212 of the covers 210 preferably extend substantially to the adjacent circuit board assembly, thus capturing as much incoming air as possible. Air flows into the plena formed by each of the circuit boards and covers, and flows out exhaust openings positioned above the heat sinks. In the vicinities of the heat sinks, the covers 210 extend only part way to the adjacent circuit board assemblies. The spaces that remain between the assemblies form exhaust plena, which pass air from the exhaust openings 214 of the individual covers 210 to the outlet side of the housing.

Preferably, each of the flanged inlets 212 forms a seal with its adjacent card, to avoid wasting cool air and to maximize the amount of air taken in under the covers 210. Gaskets or other sealing materials and/or hardware may be used to improve the seal, but are not required.

The cooling scheme described herein dramatically increases airflow to the devices that require it most, and thus improves overall cooling efficiency. In addition to concentrating airflow on the hotter components, the cooling scheme described herein also tends to increase the overall air resistance of the circuit board assembly 100. When the circuit board assembly 100 is installed in a card cage, this increase in air resistance tends to make more air available for cooling other circuit boards installed in the card cage. Moreover, the cooling scheme described herein effectively separates regions of hot air from regions of cool air. Since the hot components are generally located near exhaust openings, cool air flows over the components between the circuit board and the cover 210, and hot air flows out the exhaust openings, i.e., outside the cover and away from the components. Hot components therefore tend not to have a minimal heating effect on other components in their vicinity.

One particularly troublesome aspect of electronic system development is that power dissipation is often difficult to predict for new designs, especially for designs involving custom integrated circuits. A particular advantage of the cooling scheme disclosed herein is that it can be applied to new designs on an as-needed basis to significantly enhance the cooling of unexpectedly hot components. This ability to improve cooling after the fact increases design flexibility and reduces the risk that existing housings will not meet the cooling requirements of newly designed circuit board assemblies.

Alternatives

Having described one embodiment, numerous alternative embodiments or variations can be made. As is known, heat sinks are available in many types, sizes, and shapes. Although the invention is described herein with a heat sink having a particular appearance, it should be understood that the type, size, and shape of the heat sink could be varied widely within the scope of the invention.

In addition, the apertured cover 210 is shown and described as having sides that are formed from a single sheet of material. Alternatively, the sides could be formed using separate hardware or components mounted to the circuit board, which tend to block the flow of air. Thus, the plenum formed by the cover and the circuit board may include additional objects or materials.

As shown and described herein, the heat sinks are the tallest components on the circuit board assembly, which allows the height of the cover to be at a uniform level below the tops of the heat sinks. This need not be the case, however. The cover may include various jogs or projections to accommodate taller components not requiring heat sinks. The cover may alternatively include openings through which taller components extend, provided that air leakage through such openings is limited so that it does not significantly impair performance.

The extent to which the heat sinks project above the cover 210 may also be varied. We have found that the extent of projection, taken together with the size and shape of the heat sinks and the openings, affects the degree of cooling. Thus, the projection of the heat sinks through the exhaust openings can be varied depending upon cooling needs and the particularities of the parts that are used. Moreover, there is no requirement that the heat sinks project above the cover. The tops of the heat sinks may be flush with the cover or may lie beneath the cover.

As shown and described herein, the cover 210 is substantially rectangular. This is merely an example of one shape the cover may assume. The cover 210 could alternatively be round, have any number of sides, or have an irregular shape.

The exhaust openings 214 are shown and described herein as simple apertures formed in the cover 210. The size and shape of these apertures could be varied, depending on the size and shape of the heat sinks and the desired degree of cooling. In addition, the exhaust openings 214 could be varied in other ways.

Figure 6:
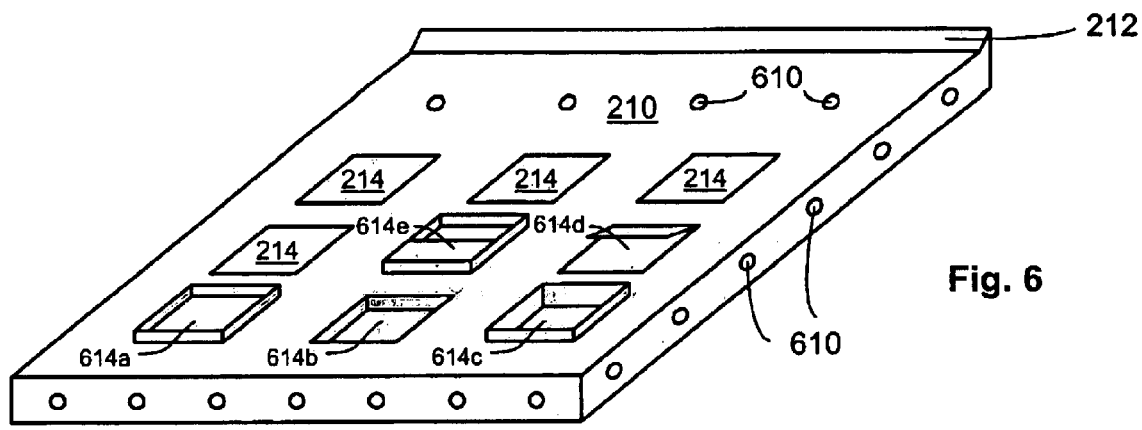
FIG. 6 is an elevated, isometric view of the apertured cover of FIGS. 2–4, showing various alternative design features.

FIG. 6 shows several variations on the design of the exhaust openings. For example, exhaust opening 614a has upwardly extending walls, opening 614b has downwardly extending walls, and exhaust opening 614c has walls that extend both upwardly and downwardly. The downwardly extending walls provide enough clearance from the circuit board to permit adequate airflow out the respective exhaust opening. These walls can be formed as parts of the cover, or can be applied to the cover as separate parts. Each of these variations assists in keeping exhausting air close to the heat sink for promoting additional heat exchange or "scrubbing." Exhaust opening 614d includes a tab, preferably formed as part of the cover 210, which extends over part of a heat sink to direct air through a smaller opening. The tab can be upwardly angled, as shown, or can be flush with the top of the cover. This variation is useful for shorter heat sinks or where less cooling is required. Exhaust opening 614e shows a combination of upwardly extending walls of opening 614a with partial blockage similar to that of opening 614d, but which can be used with taller heat sinks.

As shown and described herein, the inlet 212 and the exhaust openings 214 are the only openings provided in the cover 210. However, smaller openings 610 may be added around the sides or top of the cover 210. These openings prevent air from becoming stagnant in the vicinity of the lower power components. The smaller openings have the effect of providing more generalized cooling without significantly reducing airflow to the heat dissipative components.

The air inlet 212 is shown and described as being upwardly flanged at an angle of approximately 45-degrees. The particular angle formed by this "flap" may be varied substantially within the scope of the invention. Some of our work has shown that a 90-degree angle may actually improve performance in some situations. In addition, the cover need not strictly include an inlet "flap." Omitting it, however, when the circuit board is installed in a card cage, has the effect of wasting cooling capacity by shunting cool air around the cover and directly to the exhaust side of the card cage.

Figure 7:
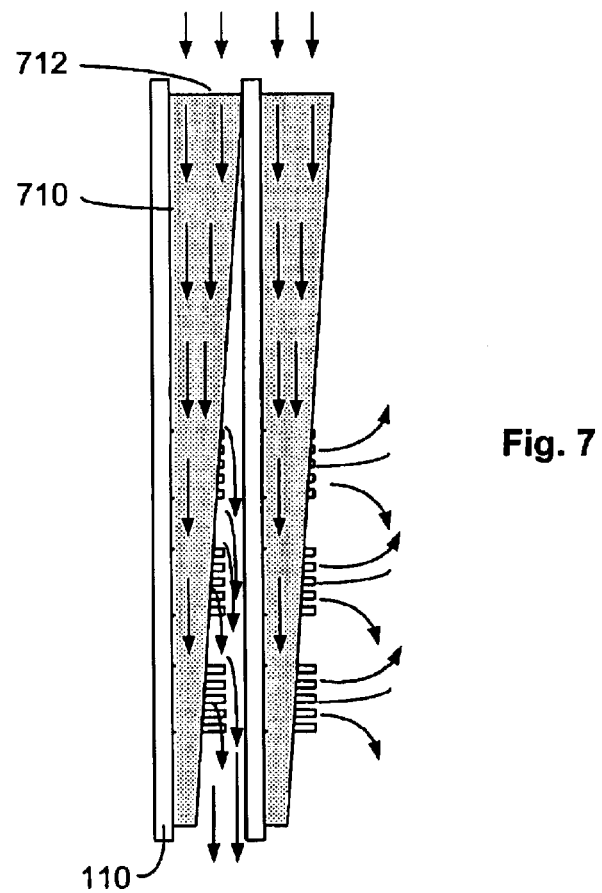
FIG. 7 is a side view of a pair of adjacent apertured covers showing additional alternative design features.

According to another variation, shown in FIG. 7, an entire cover 710 can be angled, so that it tapers from a greater height near the inlet (712) to a shorter height in the vicinity of the heat dissipative components. The cover can extend the full height (i.e., to the adjacent card) at the inlet side, and the flanged portion of the inlet can be omitted. This arrangement confers the additional benefit that it tends naturally to balance airflow among the different heat sinks, as heat sinks closer to the inlet 712 receive greater air pressure but are also more blocked than those that are further away.

While the invention has been particularly shown and described with reference to the preferred embodiments thereof, it will be understood by those skilled in the art that various changes in form and detail may be made therein without departing from the spirit and scope of the invention.

What is claimed is:

1. An electronic assembly, comprising:
   a substrate having a surface to which at least one heat dissipative component is attached; and
   a cover placed over the surface of the substrate and the at least one heat dissipative component,
   wherein the substrate and the cover together form a plenum having an air inlet for receiving forced air, and
   wherein the cover has a top surface substantially parallel to the substrate, the top surface of the cover having at least one exhaust opening positioned above the at least one heat dissipative component for concentrating exhaust air in the vicinity of the at least one heat dissipative component.

2. An electronic assembly as recited in claim 1, wherein the plenum is substantially resistant to airflow between the inside and the outside of the plenum, except at the air inlet and the at least one exhaust opening.

3. An electronic assembly as recited in claim 1, wherein the at least one exhaust opening is formed in the cover.

4. An electronic assembly as recited in claim 3,
   wherein each at least one heat dissipative component is cooled by a heat sinks, and the at least one exhaust opening comprises a different exhaust opening for each heat sinks.

5. An electronic assembly as recited in claim 4, wherein each heat sink includes fins that extend vertically upward from the surface of the substrate.

6. An electronic assembly as recited in claim 5, wherein the fins of each heat sink extend at least partially through the respective exhaust opening in the cover.

7. An electronic assembly as recited in claim 6, wherein each exhaust opening narrowly circumscribes the heat sink that extends partially though it.

8. An electronic assembly as recited in claim 1, wherein the cover has a top and four sides, three of the sides being turned down to substantially make contact with the substrate and the fourth side being substantially open for forming the air inlet.

9. An electronic assembly as recited in claim 8, wherein the air inlet is flanged upwardly away form the surface of the substrate to increase air intake.

10. An electronic assembly as recited in claim 8, wherein the cover comprises an insulative plastic material.

11. An electronic assembly, comprising:
    a plurality of circuit boards; and
    a housing for holding the plurality of circuit boards in a parallel arrangement, the housing having an intake side for receiving incoming air and an outlet side for exhausting spent air,
    wherein at least one of the plurality of circuit boards has a surface to which at least one heat dissipative component is attached and a cover placed over the surface and the at least one heat dissipative component, and wherein the surface and the cover together form a plenum having an air inlet proximate the intake side of the housing for receiving forced air, and wherein the cover has a top portion substantially parallel to the surface, the top portion having at least one exhaust opening positioned above the at least one heat dissipative component for concentrating the flow of exhaust air in the vicinity of the at least one heat dissipative component.

12. An electronic assembly as recited in claim 11, wherein the air inlet is flanged upwardly from the surface of the circuit board to increase airflow between the surface and the cover.

13. An electronic assembly as recited in claim 12, wherein the cover of each circuit board has a height in the vicinity of the at least one heat dissipative component that extends only partway to the adjacent circuit board in the housing, thereby leaving a space between cards for providing a path for exhaust air to the outlet side of the housing.

14. An electronic assembly, comprising:
    a substrate having a surface to which a plurality of heat dissipative components is attached; and
    a cover placed over the surface of the substrate and the plurality of heat dissipative components,
    wherein the substrate and the cover together form a plenum having an air inlet for receiving forced air, and
    wherein the cover has a top surface substantially parallel to the substrate, the top surface having exhaust openings formed therein and positioned proximate to different ones of the plurality of heat dissipative components.

15. An electronic assembly as recited in claim 14,
    wherein the plurality of heat dissipative components is cooled by a plurality of heat sinks, and a different exhaust opening is provided in the cover for each of the plurality of heat sinks.

16. An electronic assembly as recited in claim 15, wherein each heat sink includes fins that extend vertically upward from the surface of the substrate.

17. An electronic assembly as recited in claim 15, wherein the fins of each heat sink extend at least partially through a corresponding exhaust opening in the cover.

18. An electronic assembly as recited in claim 17, wherein each exhaust opening narrowly circumscribes the heat sink that extends partially though it.

* * * * *